(12) United States Patent
Howell et al.

(10) Patent No.: US 7,778,041 B2
(45) Date of Patent: Aug. 17, 2010

(54) INTERCONNECTION SYSTEM BETWEEN CPU AND VOLTAGE REGULATOR

(75) Inventors: David Gregory Howell, Gilbert, AZ (US); Genn-Sheng Lee, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 1008 days.

(21) Appl. No.: 11/476,318

(22) Filed: Jun. 28, 2006

(65) Prior Publication Data
US 2008/0002382 A1 Jan. 3, 2008

(51) Int. Cl.
*H05K 1/11* (2006.01)
*H05K 1/14* (2006.01)

(52) U.S. Cl. .................. 361/803; 361/700; 361/704; 361/784; 361/764

(58) Field of Classification Search ......... 361/763–764, 361/780–784, 803, 785, 700–710
See application file for complete search history.

(56) References Cited

U.S. PATENT DOCUMENTS 5,694,297 A * 12/1997 Smith et al. .................. 361/785
6,760,232 B2 * 7/2004 Smith et al. .................. 361/780
7,095,619 B2 * 8/2006 Panella et al. ................ 361/760
7,209,366 B2 * 4/2007 Prokofiev et al. ............ 361/803

* cited by examiner

*Primary Examiner*—Tuan T Dinh
(74) *Attorney, Agent, or Firm*—Andrew C. Cheng; Wei Te Chung; Ming Chieh Chang

(57) ABSTRACT

A power interconnection system is provided including a printed circuit board (10), a voltage regulator package (30), and an electrical connection socket (20) adapted for receiving a chip package (40) therein. The electrical socket and the voltage regulator package are mounted and electrically coupled to opposite surfaces of the printed circuit board. Thus, the voltage regulator package and the chip package are held in a substantially opposed relationship relative to the printed circuit board after the chip package is mounted onto the socket. Therefore, with such configuration, a lower impedance connection is achieved between the chip package and the voltage regulator package in comparison with the conventional configuration.

5 Claims, 5 Drawing Sheets

INTERCONNECTION SYSTEM BETWEEN CPU AND VOLTAGE REGULATOR

BACKGROUND OF THE INVENTION

1. Field of the Invention

The present invention relates to a power interconnection system, and more particularly to a power interconnection system for providing a low impedance connection between a chip package, such as a CPU chip, and a voltage regulator circuit.

2. Background of the Invention

Modern CPU chips require output of high current at relatively low voltage levels, typically in the range of zero to five volts. Although the CPU chip requires high current, the current demands for the requirements of the CPU chip typically fluctuate widely. For example, in the sleep or idle mode, a CPU chip might require currents varying in the range of 0.5 A to 5 A, while a CPU chip running in a faster computing mode might require currents ranging from 10 A to 100 A. However, even though current requirements for the CPU chip fluctuate widely, the voltage limits required by the CPU chip needs to remain relatively stable no matter what operation mode the CPU chip is running at.

Requirements for tight voltage regulation in response to highly variable current demands indicate that the main power supply output can no longer be fed directly to the CPU chip. Instead, a voltage regulator is utilized to deliver a tightly controlled voltage to the CPU chip. As such, a local voltage regulator can supply a high level of DC current along with minimization of the uncertainty in voltage drops between the main power supply and the CPU chip.

Suggestion exists that the voltage regulator should be placed in close proximity to the CPU chip. That is because if the voltage regulator is spaced far away from the CPU chip, impedance between the voltage regulator and the CPU chip increases with the spaced distance, thereby causing poor voltage regulation generated at the CPU chip. Furthermore, an increase in impedance will result in the decreases of speed and power delivery. As the current CPU chip tends to focus on the speed-increasing requirement as well as the effective power delivery, the increase in impedance will become less and less acceptable.

A problem with positioning the voltage regulator in close proximity to the CPU chip on a common printed circuit board is that some periphery devices may need to work with the CPU chip much more. For example, a heat sink for use with the CPU chip needs to be directly disposed above the CPU chip by its heat sink retention member fastened to the specific region peripheral to the CPU chip. Further, a few memory chips or integrated circuits also need to be close to the CPU chip for reasons of signal integrity. Therefore, in the existing power interconnection configuration, the voltage regulator is located more far away from the CPU chip, since the above periphery devices have occupied the limited board space close to the CPU chip. Obviously, as stated above, this will result in the increase of impedance and the decrease of the power delivery.

SUMMARY OF THE INVENTION

In order to resolve the existing issues encountered by the industry, the inventor provides the following solutions so as to overcome the shortcoming of the existing design. According to embodiments of the present invention, a power interconnection system is provided including a platform substrate, a voltage regulator module and an electrical connector socket. The platform substrate includes a printed circuit board with at least a first electrical contact formed on a first surface of the printed circuit board, and at least a second electrical contact formed on a second opposite surface of the printed circuit board. The electrical connector socket is mounted on the first surface of the printed circuit board and electrically coupled to the printed circuit board via the first electrical contact. The electrical connector socket is adapted to allow for a chip package to be received therein, wherein the chip package is electrically connected to the printed circuit board through the electrical connector socket. The voltage regulator module is mounted on the second surface of the printed circuit board and electrically coupled to the printed circuit board via the second electrical contact whereby the voltage regulator module is capable of delivering a controlled voltage to the chip package mounted on the electrical socket through the power interconnection system. Thus, with such configuration, a lower impedance connection is achieved between the chip package and the voltage regulator module, in comparison with the conventional connection relationship therebetween.

Other features and advantages of the present invention will become more apparent to those skilled in the art upon examination of the following drawings and detailed description of preferred embodiments, in which:

DETAILED DESCRIPTION OF ILLUSTRATIVE EMBODIMENT

Figure 1:
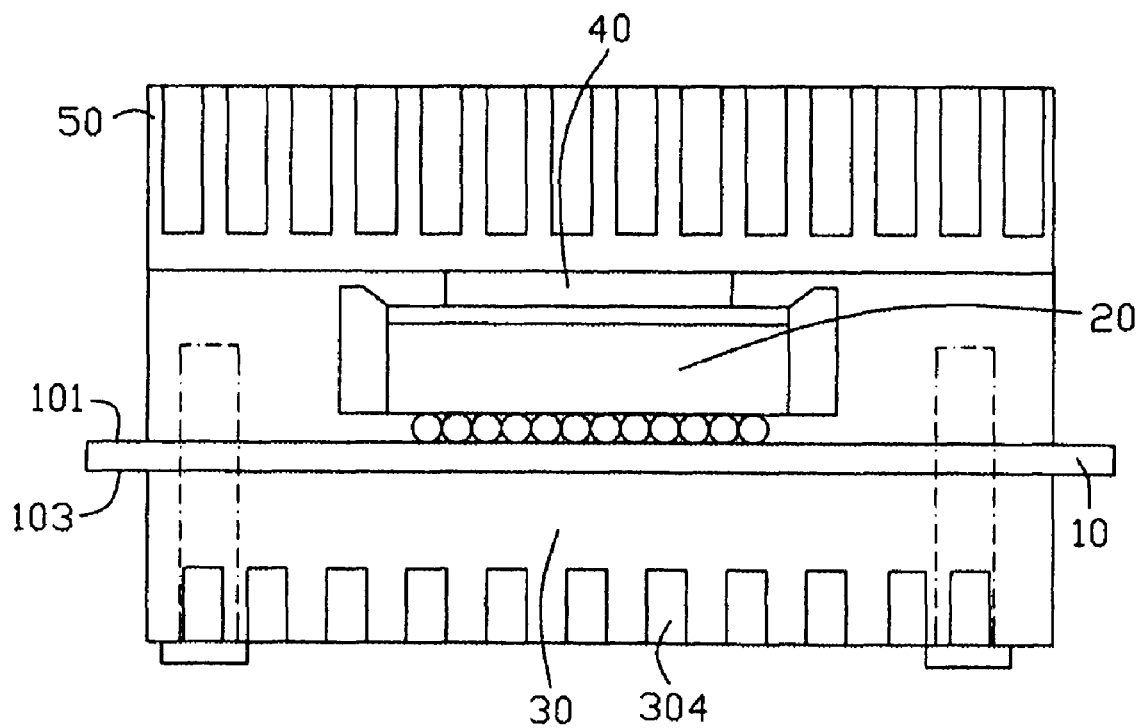
FIG. 1 is an illustration view showing a basic power interconnection system according to an embodiment of the present invention.

Referring to FIGS. 1 to 5, a power interconnection system according to the illustrative embodiment of the present invention is provided. The power interconnection system includes a platform substrate having a printed circuit board 10 with a first surface 101 adapted to face an electrical connector socket, and a second opposite surface 103 adapted to face a voltage regulator module. An electrical connector socket 20 is mounted on the first surface 101 of the printed circuit board 10 and electrically coupled to the printed circuit board via at least a first interconnect 111 formed on the first surface 101. The electrical connection socket 20 is adapted for receiving therein a chip package 40, such as a CPU, and the chip package 40 is electrically connected to the printed circuit board 10 through the electrical connector socket 20. A voltage regulator module 30 is mounted on the second opposite surface 103 of the printed circuit board 10 and electrically coupled to the printed circuit board via at least a second interconnect 113 formed on the second surface 103, to be later described. Thus, the voltage regulator module 30 is electrically connected to the chip package 40 through the printed circuit board 10, and capable of delivering a controlled voltage to the chip package 40 via the provision of the present power interconnection system.

Figure 2:
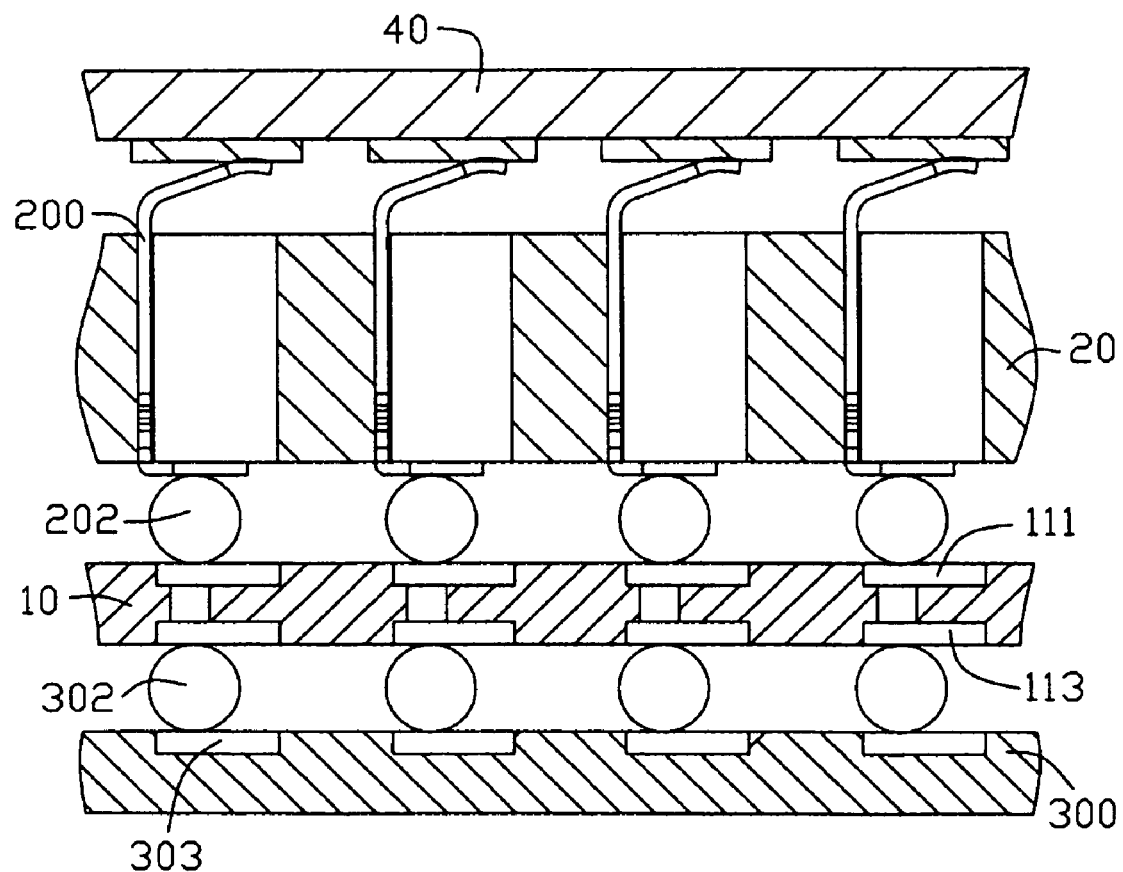
FIG. 2 is an illustration view showing electrical connection relationship between individual components of the power interconnection system of FIG. 1.
Figure 3:
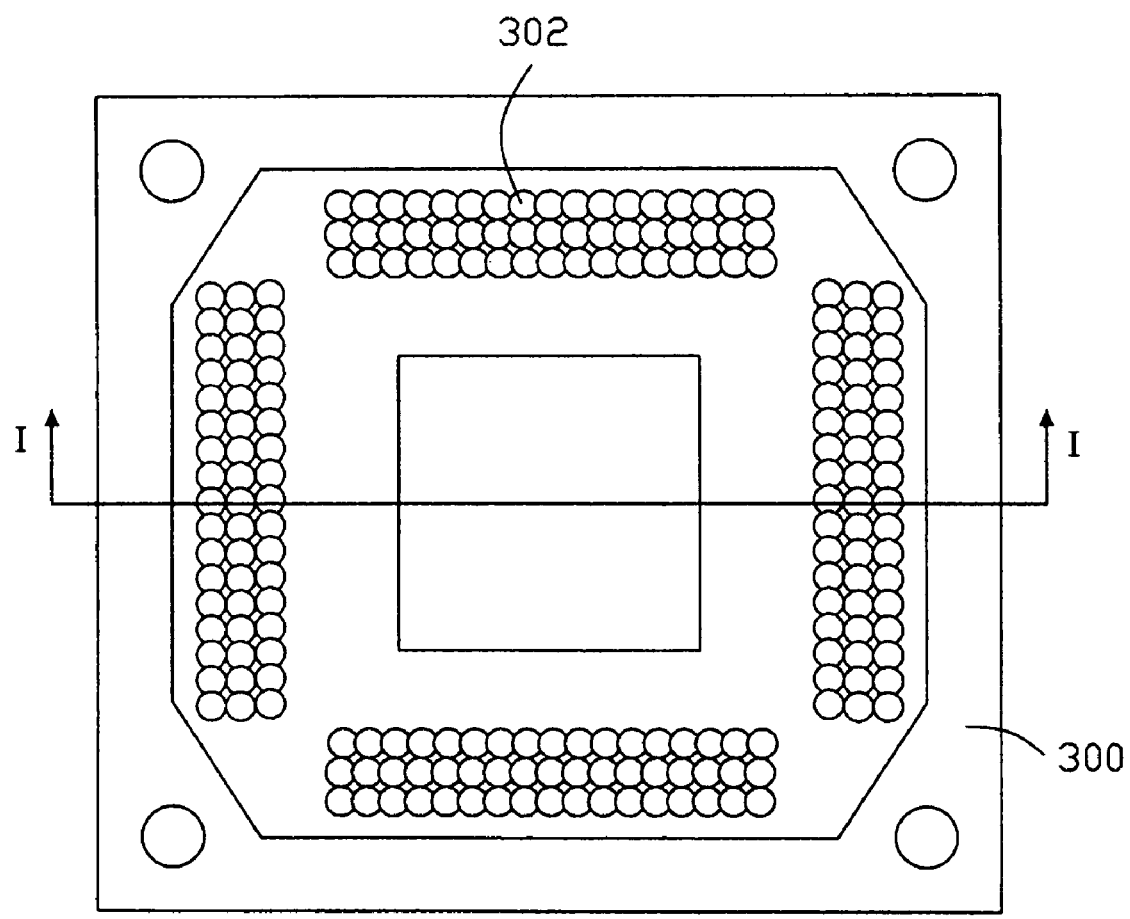
FIG. 3 is a top plan, illustration view of a voltage regulator module of FIG. 1.

The printed circuit board 10 may be comprised of multiple interconnects, such as vias, and traces or contact pads, that are embedded in the printed circuit board 10. These interconnects represent separate signal, power and/or ground paths. Referring particularly to FIG. 2, the printed circuit board 10 of the present embodiment has first and second interconnects, such as contact pads 111 and 113, on opposite surfaces thereof, for electrically coupling to the electrical socket 20 and the voltage regulator module 30.

The electrical connection socket 20 can be any suitable socket, such as one single part socket, or two or more socket elements combined to form the complete socket, which is not to be limited thereto. The electrical connection socket 20 defines a receiving region, such a cavity formed in the middle thereof, for receiving the chip package 40 therein. Under the receiving region, a plurality of conductive elements 200, such as terminals, is embedded within the electrical socket 20. In some embodiments, clamping means may be utilized to produce a large clamping force exerted against the chip package 40 assembled within the electrical socket 20 to retain the package in contact with the terminals 200 of the socket 20, so as to form a reliable electrical connection between the chip package 40 and the electrical socket 20. In the present embodiment, the electrical socket 20 preferably forms a plurality of solder balls 202 on a bottom surface thereof, and is electrically coupled to the first interface 101 of the printed circuit board 10 by the solder balls 202 soldered to corresponding first contact pads 111 of the printed circuit board 10. In addition, after the electrical socket 20, with the chip package 40 assembled therein, is mounted on the first interface 101 of the printed circuit board 10, heat dissipation means 50, for example a fan-driven cooler, is fastened to and disposed above the electrical socket 20 to help the chip package 40 mounted on the socket 20 to remove heat therefrom, thereby assuring the chip package 40 runs properly.

In the present embodiment, the voltage regulator module 30 is preferably formed as a package with a packaging substrate 300 thereof. The components, included in the voltage regulator module 30, are welded onto the packaging substrate 300 with the contact ends 303 thereof exposed on a top surface of the packing substrate 300. A plurality of solder balls 302 is attached to the contact ends 303 of the packing substrate 300, and the voltage regulator package 30 is soldered to the second contact pads 113 of the printed circuit board 10 by these solder balls 302. After the voltage regulator package 30 is assembled to the printed circuit board 10, the voltage regulator package 30 and the chip package 40 are held in opposed relationship relative to the printed circuit board 10. In the present embodiment, the voltage regulator package 30 is disposed just beneath the chip package 40 or slightly offset from the chip package 40 in a vertical direction relative to the printed circuit substrate 10, such that impedance between the voltage regulator package 30 and the chip package 40 is lower than the conventional configuration, where the voltage regulator is spaced by another components in a horizontal direction along a common board surface and arranged far away from the chip package.

Figure 4:
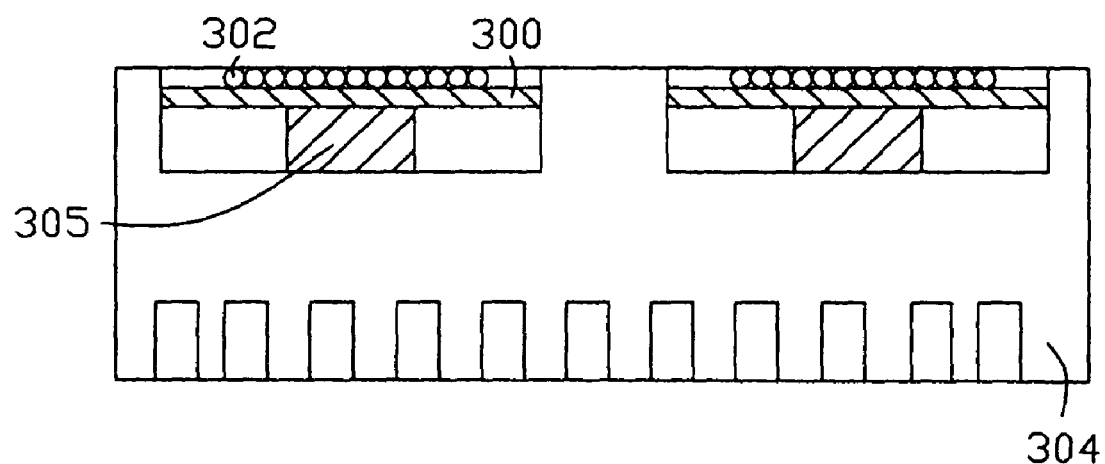
FIG. 4 is a cross sectional view of the voltage regulator module of FIG. 3, taken along the line of I-I thereof.
Figure 5:
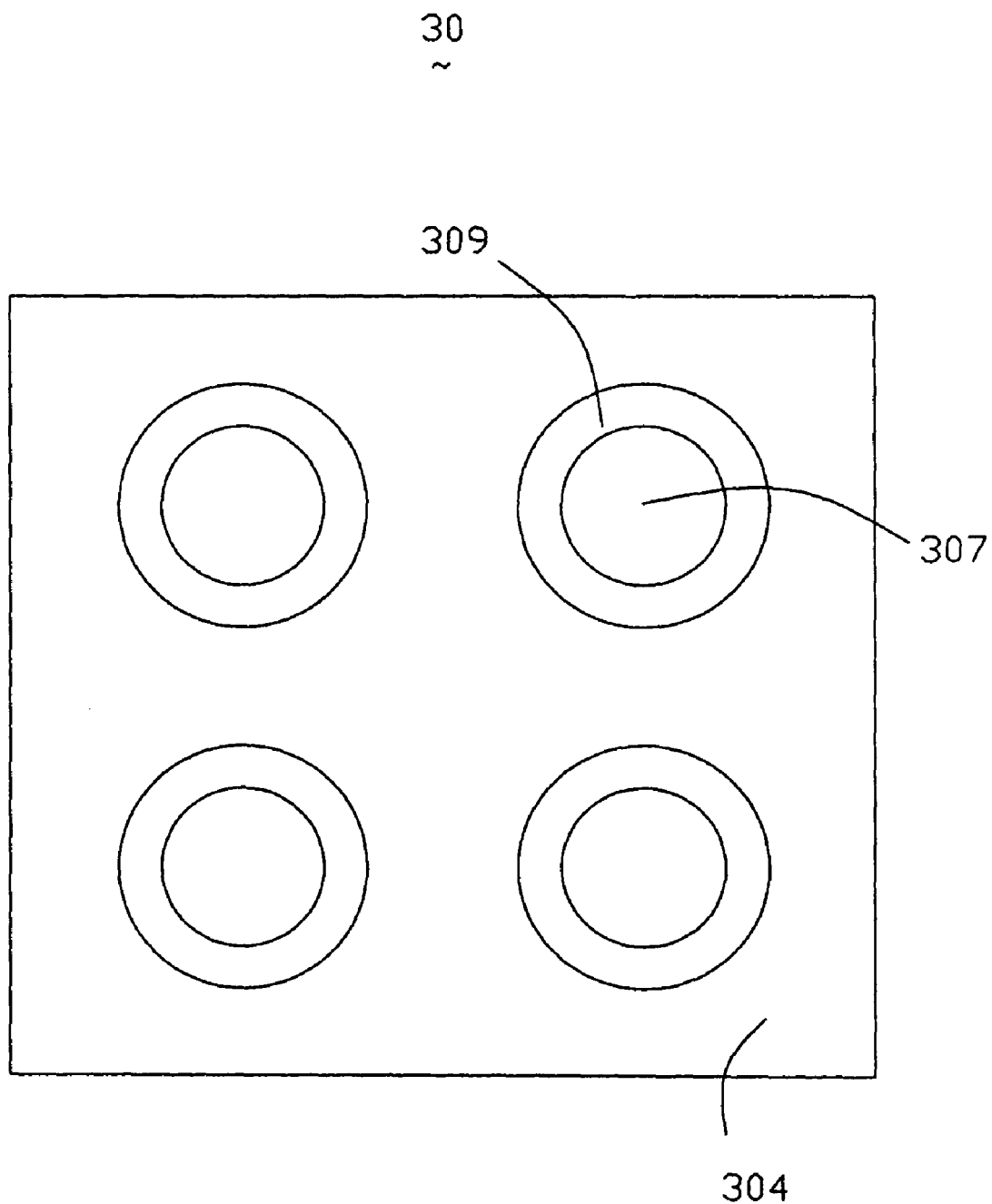
FIG. 5 is a bottom plan, illustration view of the voltage regulator module of FIG. 3.

Referring to FIGS. 4 to 5, the voltage regulator package 30 includes a plurality of heated components 305, 307 with different heights thereof, such as MOSFETs, capacitance, and inductance. After the voltage regulator package 30 is assembled onto the printed circuit board 10, an enclosure with a heat sink plate 304 on a bottom thereof, is fastened to enclose the voltage regulator package 30 for facilitating the voltage regulator package 30 remove heat therefrom. In the present embodiment, the heat sink plate 304 is arranged such that a few relatively lower heated components 305, such as MOSFETs, are covered by the heat sink plate 304, while a few higher heated components 307, such as capacitance or inductance, are exposed out of the heat sink plate 304 by extending through the heat sink plate 304. More specifically, the heat sink plate 304 is formed with the corresponding number of holes 309 for the higher heated components 307 to extend therethrough, and the lower heated components 305 has their top surfaces thereof abutting against the heat sink plate 304 while not exceeding out of the heat sink plate 304. Thus, through a suitable arrangement of lower and higher heated components 305, 307, the overall height of the whole power interconnection system is effectively decreased to a predetermined height for complying with the requirements of certain electronic packages.

While the voltage regulator module 30 having electronic components assembled to the single packaging substrate 300 is preferred, electronic components of the voltage regulator module 30 without a support packaging substrate 300 thereof may also be employed by directly mounting the bare electronic devices to the printed circuit board 10 in other alternative embodiments of the present invention.

Referring particularly to FIG. 1 to 2, in assembly, the electrical socket 20 with the chip package 40 assembled therein is mounted and electrically coupled to the printed circuit board 10 by its solder balls 202 soldered onto the first contact pads 111 formed on the first surface 101 of the printed circuit board 10. Then the fan-driven heat dissipation means 50 is fastened to the electrical connection socket 20. The voltage regulator package 30 is arranged in a substantially opposed relationship with the chip package 40 in a vertical direction relative to the printed circuit board 10, and mounted and electrically coupled to the printed circuit board 10 with its solder balls 302 soldered onto the second contact pads 113 on the opposite surface of the printed circuit board 10. Thus, through the present configuration, a lower impedance connection is achieved between the chip package 40 and the voltage regulator package 30. The enclosure is fastened to the voltage regulator package 30 such that the higher heated components 307 extend through the corresponding holes 309 formed on the heat sink plate 304, and the lower heated components 305 are covered by the heat sink plate 304.

While the present invention has been described with reference to illustrative embodiments, the description of the invention is illustrative and is not to be construed as limiting the invention. Various of modifications to the present invention can be made to illustrative embodiments by those skilled in the art without departing from the true spirit and scope of the invention as defined by the appended claims.

What is claimed is:

1. A power interconnection system comprising:
    a printed circuit board defining opposite first and second surfaces;
    a CPU assembly electrically and mechanically mounted on the first surface;
    a voltage regulator package electrically and mechanically mounted on the second surface, the voltage regulator package having a package substrate face with a plurality of solder balls thereon, the voltage regulator package soldered onto the second surface of the printed circuit board by said solder balls,
    a heat sink plate assembled onto the voltage regulator package, the voltage regulator package having at least one heated component with its surface abutting against the heat sink plate but not exceeding out of the heat sink plate, the heat sink plate being formed with at least one hole, which is adapted for a heated component to be exposed out of the heat sink plate by extending through the heat sink plate; wherein the CPU assembly is electrically driven by said voltage regulator package.

2. The power interconnection system as described in claim 1, wherein said CPU assembly includes a connector directly mounted upon the printed circuit board and a CPU mounted thereon.

3. The power interconnection system as described in claim 2, wherein the CPU assembly includes a first heat sink.

4. The power interconnection system as described in claim 3, wherein the voltage regulator package includes a second heat sink.

5. The power interconnection system as described in claim 4, wherein said first heat sink and said second heat sink are located by two opposite surfaces, respectively.

* * * * *